US006850115B2

(12) United States Patent
Gurvich et al.

(10) Patent No.: US 6,850,115 B2
(45) Date of Patent: Feb. 1, 2005

(54) ENHANCED EFFICIENCY LDMOS BASED FEED FORWARD AMPLIFIER

(75) Inventors: Mark Gurvich, Costa Mesa, CA (US); Nikolai Maslennikov, Huntington Beach, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 10/633,984

(22) Filed: Aug. 4, 2003

(65) Prior Publication Data

US 2004/0036532 A1 Feb. 26, 2004

Related U.S. Application Data

(60) Provisional application No. 60/405,942, filed on Aug. 26, 2002.

(51) Int. Cl.[7] .................................................. H03F 1/00
(52) U.S. Cl. ....................................... 330/151; 330/149
(58) Field of Search ............................. 330/151, 149; 375/297; 455/63

(56) References Cited

U.S. PATENT DOCUMENTS

| | | | |
|---|---|---|---|
| 4,595,882 A | * | 6/1986 | Silagi et al. ................. 330/151 |
| 5,166,634 A | | 11/1992 | Narahashi et al. |
| 5,334,946 A | | 8/1994 | Kenington et al. |
| 5,742,201 A | | 4/1998 | Eisenberg et al. |
| 5,808,512 A | | 9/1998 | Bainvoll et al. |
| 5,877,653 A | | 3/1999 | Kim et al. |
| 5,912,586 A | | 6/1999 | Mitzlaff |
| 5,917,375 A | | 6/1999 | Lisco et al. |
| 5,923,215 A | | 7/1999 | Hans |
| 5,994,957 A | | 11/1999 | Myer |
| 6,188,732 B1 | | 2/2001 | Rha |
| 6,275,105 B1 | | 8/2001 | Ghannouchi et al. |
| 6,292,058 B1 | | 9/2001 | Ide et al. |
| 6,304,145 B1 | | 10/2001 | Laureanti et al. |
| 6,320,461 B1 | | 11/2001 | Lee |
| 6,326,840 B1 | | 12/2001 | Funada et al. |
| 6,326,845 B1 | | 12/2001 | Miyaji et al. |
| 6,340,914 B1 | | 1/2002 | Gavrilovic |
| 6,340,915 B1 | | 1/2002 | Blodgett |
| 6,388,515 B1 | | 5/2002 | Nishida |
| 6,417,731 B1 | * | 7/2002 | Funada et al. ............... 330/149 |
| 6,424,214 B2 | * | 7/2002 | Sera et al. ................... 330/151 |
| 6,489,844 B2 | | 12/2002 | Yamashita et al. |
| 6,504,428 B2 | | 1/2003 | Cova et al. |
| 6,504,430 B2 | | 1/2003 | Matsuge |
| 6,525,603 B1 | | 2/2003 | Morgan |
| 2001/0015673 A1 | | 8/2001 | Yamashita et al. |
| 2001/0020868 A1 | | 9/2001 | Kim |
| 2002/0008577 A1 | | 1/2002 | Cova et al. |
| 2002/0113648 A1 | | 8/2002 | Miyaji et al. |
| 2002/0125948 A1 | | 9/2002 | Haigh et al. |
| 2002/0153951 A1 | | 10/2002 | Cavers |
| 2003/0001669 A1 | | 1/2003 | Billsberry |
| 2003/0011428 A1 | | 1/2003 | Yamakawa et al. |
| 2003/0020541 A1 | | 1/2003 | Ishida et al. |

* cited by examiner

*Primary Examiner*—Henry Choe
(74) *Attorney, Agent, or Firm*—Myers Dawes Andras & Sherman

(57) ABSTRACT

A feed forward amplifier employing high efficiency main and/or error amplifiers with amplifier devices biased in a lower bias class. Small signal nonlinearities in the gain response of the amplifier devices are compensated by a small signal gain adjustment circuit. The resulting gain response is substantially linear over the entire usable range of RF input power.

8 Claims, 4 Drawing Sheets

ENHANCED EFFICIENCY LDMOS BASED FEED FORWARD AMPLIFIER

RELATED APPLICATION INFORMATION

The present application claims priority under 35 USC 119(e) of provisional application Ser. No. 60/405,942 filed Aug. 26, 2002, the disclosure of which is incorporated herein by reference in its entirety.

BACKGROUND OF THE INVENTION

1. Field of the Invention

The present invention relates in general to RF power amplifiers and methods of amplifying an RF signal. More specifically, the present invention relates to feed forward power amplifiers and related methods.

2. Description of the Prior Art and Related Information

The two primary goals of RF power amplifier design are linearity over the range of power operation and efficiency. Linearity is simply the ability to amplify without distortion while efficiency is the ability to convert DC to RF energy with minimal wasted power and heat generation. Both these requirements are critical for modern wireless communication systems but it is increasingly difficult to provide both. This is due primarily to the bandwidth requirements of modern wireless communication systems which are placing increasing demands on amplifier linearity. As a practical matter the only way to provide the desired linearity has been to employ very large amplifiers operating in a low efficiency point of their operating range where they are more linear.

One approach to achieving higher linearity and good efficiency in RF power amplifiers is provided by feed forward amplifiers. In feed forward RF power amplifiers an error amplifier is employed to amplify only IMD products which are then combined with the main amplifier output to cancel the main amplifier IMDs. FIG. 1 illustrates a conventional feed forward amplifier design having a main amplifier 1 and an error amplifier 2. The basic elements also include delays 3, 4 in the main and error path, respectively, and main to error path couplers 5, 6, 7 and 8. Additional elements not shown are also typically present in a conventional feed forward architecture as is well known to those skilled in the art. The delays, couplers and error amplifier are designed to inject out of phase IMDs from the error path into the main amplifier output at coupler 8 to substantially eliminate the IMDs in the main amplifier path.

Generally, feed forward power amplifier design is based upon using class A or AB biased transistors, both in the main and error amplifiers. In order to obtain higher efficiency from the output stage LDMOS (Laterally Diffused Metal Oxide Semiconductor) devices in an amplifier, they must be biased towards lower class AB or in class B. However, when biased in this mode, considerable gain expansion occurs, especially at lower power outputs. This is illustrated in FIG. 2 which shows both conventional higher AB biasing and lower class AB or class B biasing. As shown a nonlinear gain expansion occurs in a small signal region (below input power Psst—small signal threshold). This gain expansion also creates a substantial amount of small signal intermodulation distortion products (SSIMDs). The error amplifier 2 operates essentially in pulsed mode, and draws practically only quiescent current. Biasing the output devices of the error amplifier at lower class AB or in class B further reduces quiescent current. However, lower class AB and class B biasing makes the error loop cancellation at coupler 8 input power dependent. This is contradictory to the fundamental concept of feed forward amplifier operation and is inherently difficult to deal with.

Therefore, when the main amplifier is biased in lower class AB or in class B, it generates substantial small signal IMDs. These IMD products in turn cause the error amplifier to draw substantially higher current to compensate so that any efficiency improvement is lost at the system level. As a result, an attempt to increase efficiency by biasing the amplifier devices at lower class AB or in class B is frustrated in this manner.

Therefore, a need presently exists for an RF power amplifier design which provides both high efficiency and reduced signal distortion.

SUMMARY OF THE INVENTION

In a first aspect the present invention provides an amplifier having an input for receiving a signal to be amplified and an amplifier device biased to have a nonlinear gain characteristic in the small signal region. A small signal linearization circuit is coupled between the input and the amplifier device for compensating for the small signal nonlinearity of the amplifier device. The amplifier further includes an output coupled to the amplifier device for outputting the amplified signal.

The amplifier device is preferably biased in lower class AB or in class B for high efficiency. In a preferred embodiment the amplifier device is an LDMOS transistor. The small signal gain adjustment circuit preferably has a gain response substantially opposite to the gain response of the amplifier device. In particular, the amplifier device may have a gain expansion in the small signal region and the small signal linearization circuit reduces the input signal magnitude over the portion of the gain response of the amplifier device corresponding to the small signal region. The portion of the gain response of the amplifier device corresponding to the small signal region may, for example, comprise the range of about −15 dB to −5 dB of maximum input power of the amplifier device.

In one preferred embodiment the small signal linearization circuit may comprise a first and second diode in parallel coupled between the signal input path and ground and a resistor coupled in series with the first and second diode and ground. In an alternate embodiment the small signal linearization circuit may comprise an envelope detector and a gain control circuit controlled in response to the envelope of the input signal detected by the envelope detector. In such an embodiment the small signal linearization circuit may further comprise a video amplifier coupled between the envelope detector and the gain control circuit.

In another aspect the present invention provides an RF feed forward amplifier having an RF input for receiving an RF signal and a main amplifier receiving and amplifying the RF signal, wherein the main amplifier comprises one or more amplifier devices biased to have a nonlinear gain characteristic in the small signal region. A main path small signal gain adjustment circuit is coupled between the RF input and the main amplifier for compensating for the small signal nonlinearity of the one or more amplifier devices in the main amplifier. The feed forward amplifier further includes a main amplifier output sampling coupler, a first delay coupled to the RF input and providing a delayed input RF signal, and a carrier cancellation combiner coupling the delayed RF signal to the sampled output from the main amplifier and providing an error signal. An error amplifier is provided which receives and amplifies the error signal. A second delay is coupled to the output of the main amplifier and an error injection coupler combines the output from the error amplifier and the delayed main amplifier output from the second delay so as to cancel distortion introduced by the main amplifier. An RF output is coupled to the error injection coupler output and provides an amplified RF output. The error amplifier may also comprise one or more amplifier devices biased to have a nonlinear gain characteristic in the small signal region and the RF feed forward amplifier may further comprise an error path small signal gain adjustment circuit coupled between the carrier cancellation combiner and the error amplifier for compensating for the small signal nonlinearity of the one or more devices in the error amplifier.

Preferably, the main amplifier and error amplifier devices are biased in lower class AB or in class B, for high efficiency. The main amplifier device nonlinear gain characteristic may comprise a gain expansion over a small signal portion of the input signal and the main path small signal gain adjustment circuit compresses the RF input signal over the small signal portion of the input signal. For example, the small signal portion of the input signal may comprise the input signal power region less than about Pin (max) −5 db, where Pin (max) is the saturation level of the main amplifier devices. The error amplifier device nonlinear gain characteristic may similarly comprise a gain expansion over a small signal portion of the error signal and the error path small signal gain adjustment circuit compresses the error signal over the small signal portion of the error signal.

In a further aspect the present invention provides a method for compensating for nonlinearity in the small signal region of an amplifier device. The method comprises receiving an input signal to be amplified by the amplifier device and applying a nonlinear compensating gain to the input signal only when the input signal is in a small signal region and outputting a gain compensated signal. The gain compensated signal is then provided to the amplifier device.

For example, the method for compensating for nonlinearity in the small signal region of an amplifier device may be employed where the amplifier device is an LDMOS device. Preferably, the amplifier device is biased in lower class AB or in class B for high efficiency. The small signal region of the input signal may, for example, comprise the input signal power region less than about Pin (max) −5 db, where Pin (max) is the saturation level of the amplifier device. The amplifier device nonlinearity may comprise a gain expansion in the small signal region and applying a nonlinear compensating gain to the input signal may comprise applying a gain compression to the input signal.

Further features and advantages will be appreciated by review of the following detailed description of the invention.

DETAILED DESCRIPTION OF THE INVENTION

The present invention provides a feed forward amplifier and signal linearization method which substantially eliminates all the above mentioned problems and achieves better overall system efficiency even when the main and/or error amplifier are biased in a substantially lower bias class for higher efficiency.

Figure 3:
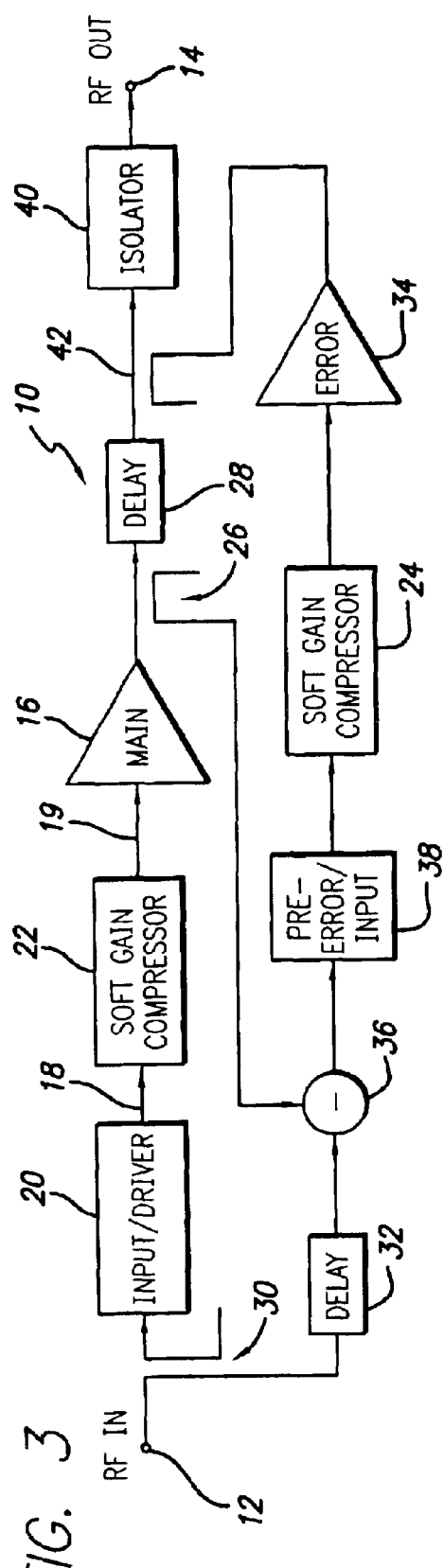
FIG. 3 is a block diagram of a preferred embodiment of a feed forward power amplifier in accordance with the invention.

Referring to FIG. 3 a block diagram of a preferred embodiment of a feed forward power amplifier in accordance with the invention is illustrated. Although a feed forward amplifier is illustrated it should be appreciated that the present invention may also be implemented in other amplifier designs. The feed forward amplifier 10 includes an input 12 which receives an input RF signal to be amplified and an output 14 which outputs the amplified RF signal. The input RF signal is split into a main amplifier signal path and an error amplifier signal path at input coupler 30 in accordance with well known feed forward amplifier design.

Figure 1:
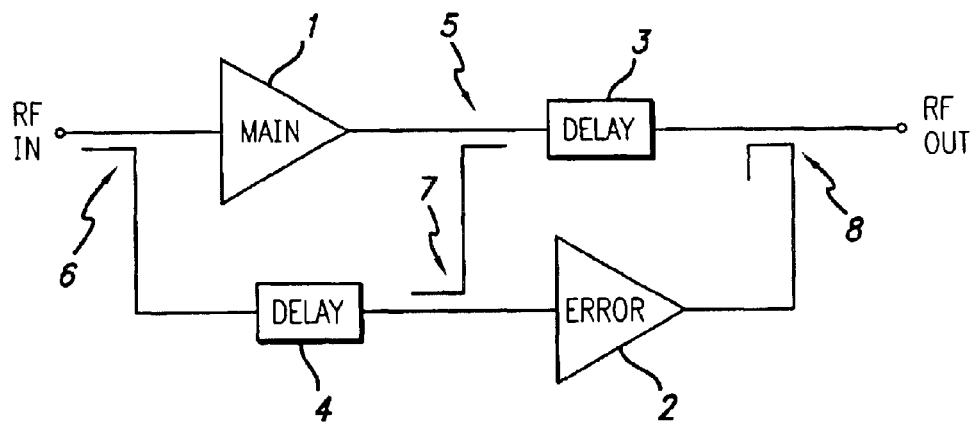
FIG. 1 is a block diagram of a prior art feed forward power amplifier.
Figure 2:
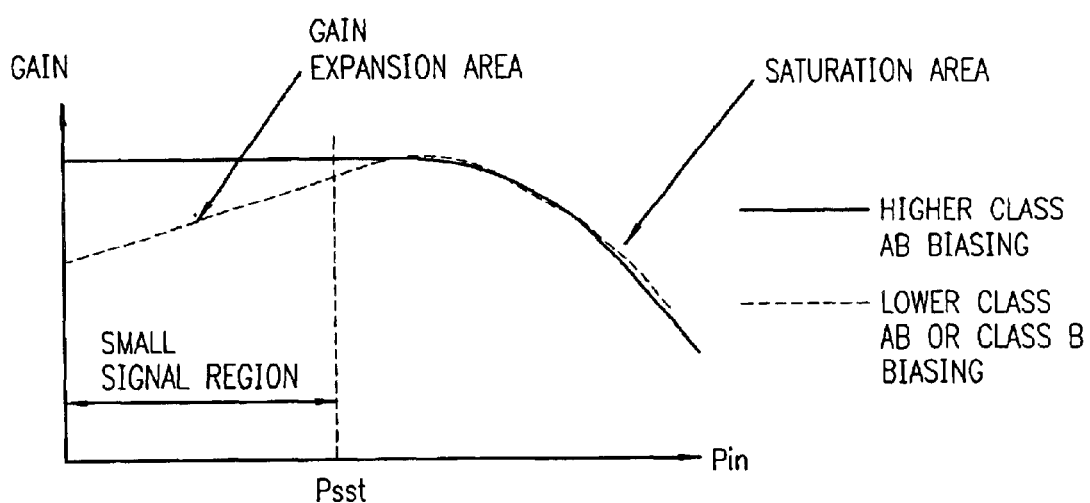
FIG. 2 is a plot of the transfer characteristic of an LDMOS amplifier device employed in the feed forward power amplifier of FIG. 1 illustrating the gain characteristic over the operating range showing small signal nonlinearity.

The main amplifier signal path includes main amplifier 16 which is preferably an LDMOS amplifier, or an amplifier module comprised of several LDMOS amplifier devices or stages, biased in a high efficiency mode of operation. More specifically, main amplifier 16 preferably employs LDMOS devices biased at a bias class such as lower AB or class B so that good DC to RF conversion efficiency is provided and wasted power and heat are minimized. As a result, however, this also creates a substantial amount of small signal intermodulation products (SSIMDs) as discussed above in relation to FIG. 2. To address this problem, a small signal linearization circuit 22 is used preceding the main amplifier 16, so that the small signal gain expansion of the LDMOS device(s) (AM/AM gain characteristic) is compensated for. Since the nonlinearity is due to a gain expansion effect, this linearization circuit provides a compensating gain compression, and is illustrated in the preferred embodiment as a soft gain compressor circuit. That is, the soft gain compressor 22 receives the RF input signal on line 18 and outputs a compensated RF signal on line 19 having a reduced gain in the small signal region and the main amplifier 16 amplifiers this compensated signal. The result is a linearized gain response for the main amplifier devices. The operation of the soft gain compressor 22 will be described in more detail below in relation to FIGS. 4–8. The main amplifier signal path may further include conventional circuitry such as input driver circuitry 20. The input circuitry may include a preamplifier, group delay circuitry, and gain and phase control circuitry generally in accordance with conventional feed forward design. The main amplifier signal path further includes a main amplifier output sample coupler 26 and delay 28, generally in accordance with conventional feed forward design. The main amplifier signal path may further include additional conventional circuitry well known to those skilled in the art (such as pilot signal generation and control circuitry-not shown).

The error amplifier signal path includes input signal coupler 30 which samples the RF input signal and provides it to the error amplifier 34 via delay 32, attenuator/combiner 36 and pre-error/input circuitry 38. More specifically, delay 32 and attenuator/combiner 36 operate as in a conventional feed forward amplifier such that the sampled output of the main amplifier 16 is attenuated and combined out of phase with the delayed input signal at attenuator/combiner 36 to substantially cancel all but the distortion component of the sampled signal from the main signal path. In some applications and implementations it may be advantageous to control the cancellation at attenuator/combiner 36 to retain some RF carrier component in the resulting signal and the resulting signal is not purely the distortion component of the main amplifier. Nonetheless, for the purposes of the present application the resulting signal will be referred to as the distortion component and it should be understood some carrier component may be included. This distortion component of the signal is provided to pre-error/input circuitry 38. Pre-error/input circuitry 38 may include a preamplifier, group delay circuitry, and gain and phase control circuitry which operates similarly to circuitry 20. The output of circuitry 38 is provided to error amplifier 34 which restores the magnitude of the sampled distortion components (IMDs) to that in the main signal path. Error amplifier 34 also preferably employs one or more LDMOS amplifier devices or stages biased at a bias class such as lower AB or class B so that good DC to RF conversion efficiency is provided and wasted power and heat are minimized. As a result, however, this also creates a substantial amount of small signal intermodulation products (SSIMDs) as discussed above. Accordingly, a small signal linearization circuit 24, preferably implemented as a soft gain compressor circuit, is also employed preceding the error amplifier 34, so that the small signal gain expansion of the LDMOS device(s) (AM/AM gain characteristic) of the error amplifier 34 is compensated for. The amplified distortion component output from error amplifier 34 is combined with the delayed main signal at 180 degrees (out of phase) with the main amplifier output signal at error injection coupler 42 to cancel the distortion component in the main signal path. A substantially distortion free amplified signal is then provided to isolator 40 and to the output 14.

Figure 4:
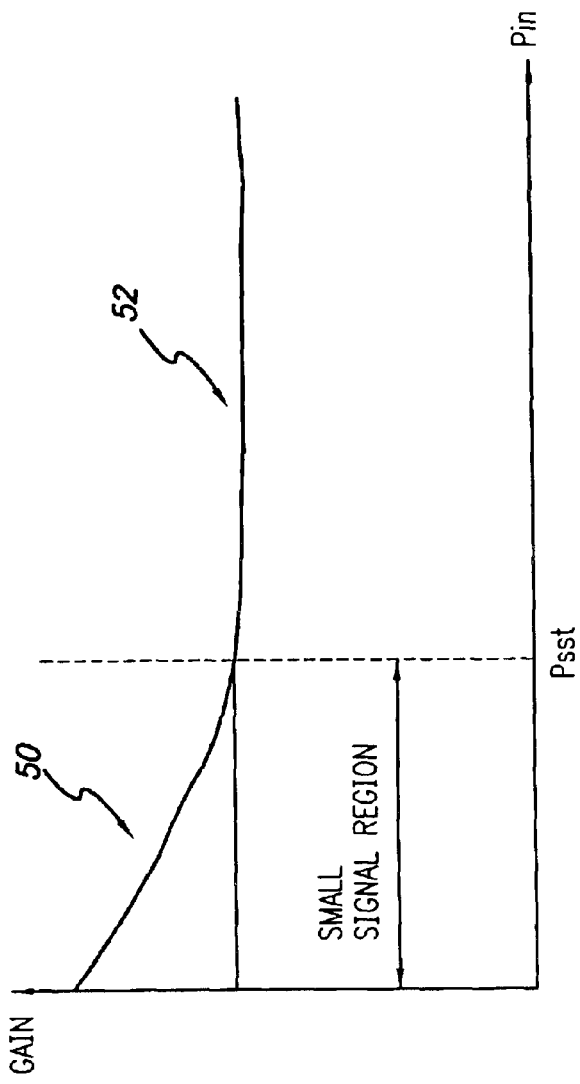
FIG. 4 is a plot of the general gain characteristic of the soft gain compressor employed in the feed forward power amplifier of FIG. 3 over the operating power range.
Figure 5:
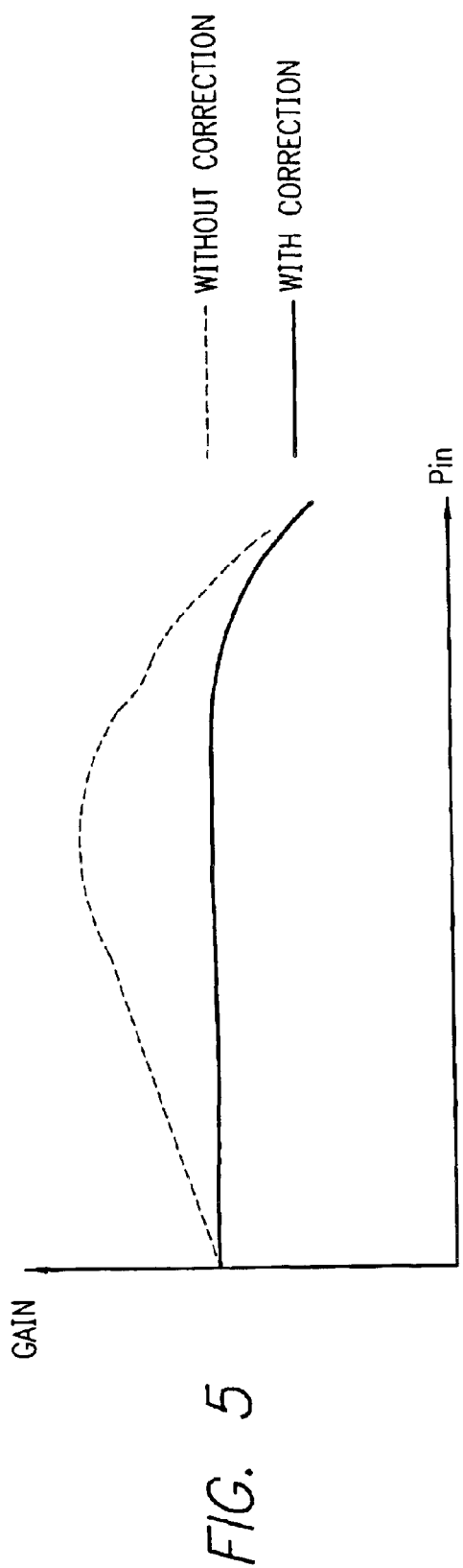
FIG. 5 is a plot of the transfer characteristic of an LDMOS amplifier device employed in the feed forward power amplifier of FIG. 3 illustrating the gain characteristic over the operating range showing reduced small signal nonlinearity.

Referring next to FIGS. 4 and 5 the general operation of the small signal linearization circuit 22, 24 will be described. The preferred implementation is a gain compression circuit and the general form of the gain compressor gain response is shown in FIG. 4. As may be seen by comparing FIG. 4 and FIG. 2, the gain compressor gain response is only nonlinear in the soft (small signal) region (below Psst) and is generally opposite to the LDMOS gain response shown in FIG. 2 (at least in the small signal region). That is, the gain response has a first nonlinear portion 50, corresponding to the small signal region of the input power, with a negative slope providing a gain compression, and a second substantially linear portion 52 outside the small signal region. The resulting gain response of the main amplifier output is corrected to be constant across the power range as shown in FIG. 5.

Figure 6:
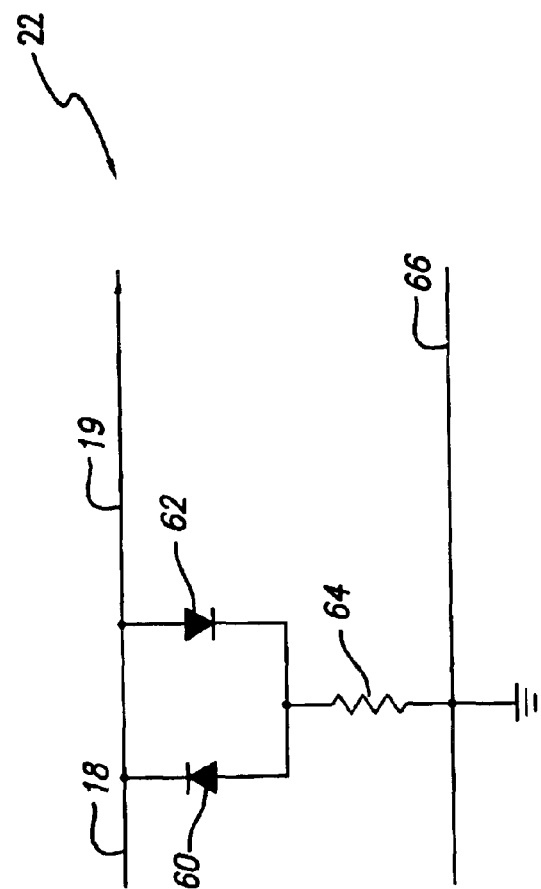
FIG. 6 is a schematic drawing of a first preferred embodiment of the soft gain compressor employed in the feed forward power amplifier of FIG. 3, in accordance with the invention.
Figure 7:
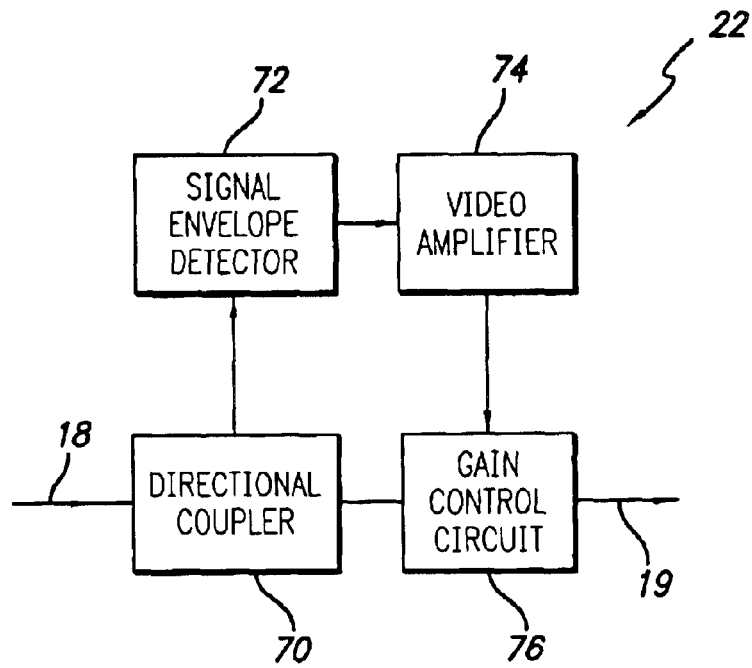
FIG. 7 is a block schematic drawing of another preferred implementation of the soft gain compressor employed in the feed forward power amplifier of FIG. 3, in accordance with the invention.

Two implementations of the soft gain compressor 22 (or 24) are illustrated in FIGS. 6 and 7. These specific implementations are provided as examples only since a variety of different specific circuit implementations are possible.

Referring first to FIG. 6, a first implementation of soft gain compressor 22 (or 24) is illustrated in a schematic drawing. The soft gain compressor circuit in this implementation includes diodes 60 and 62 and resistor 64 coupled between the RF signal path and ground 66 as shown. Diodes 60, 62 will track the RF signal envelope provided on line 18 and as the power of the input RF signal increases they will shunt increasing power to ground providing a gain compensated signal on line 19. The threshold values of the diodes 60, 62 and resistance of resistor 64 are chosen so this shunt current will saturate at the beginning of the linear portion 52 shown in FIG. 4 (i.e. at Psst). The circuit of FIG. 6 will thus have a gain response generally corresponding to the desired soft gain compression curve shown in FIG. 4 above. The specific values of diodes 60 and 62 and resistor 64 will depend on the specific implementation including the number and size of the specific main and error amplifier LDMOS devices used and their bias point. One example of a specific gain response purely for illustrative purposes, is indicated in FIG. 8, discussed below.

Referring to FIG. 7, another implementation of the soft gain compressor is illustrated in a block schematic drawing.

As shown in FIG. 7, the soft gain compressor 22 (or 24) comprises a directional coupler 70 which receives the RF input signal along line 18 and provides a sampled input signal to signal envelope detector 72 and provides the RF input signal to gain control circuit 76. The signal envelope detector 72, which may be a simple diode based detector or other well known envelope detector, provides a signal corresponding to the RF signal envelope to amplifier 74. Since the envelope varies with the video (or modulation) frequency, amplifier 74 is indicated as a video amplifier and provides an amplified video envelope signal as a control signal to gain control circuit 76. Gain control circuit 76 is a high speed gain control circuit of a type which is commercially available (e.g., by Analog Devices as part no. AD8345) or which may be readily designed by one skilled in the art as a discrete circuit for the particular video frequency of the RF signal for the particular application. Gain control circuit 76 reduces the gain of the input RF signal in response to the video envelope control signal to reproduce the gain response curve of FIG. 4.

Figure 8:
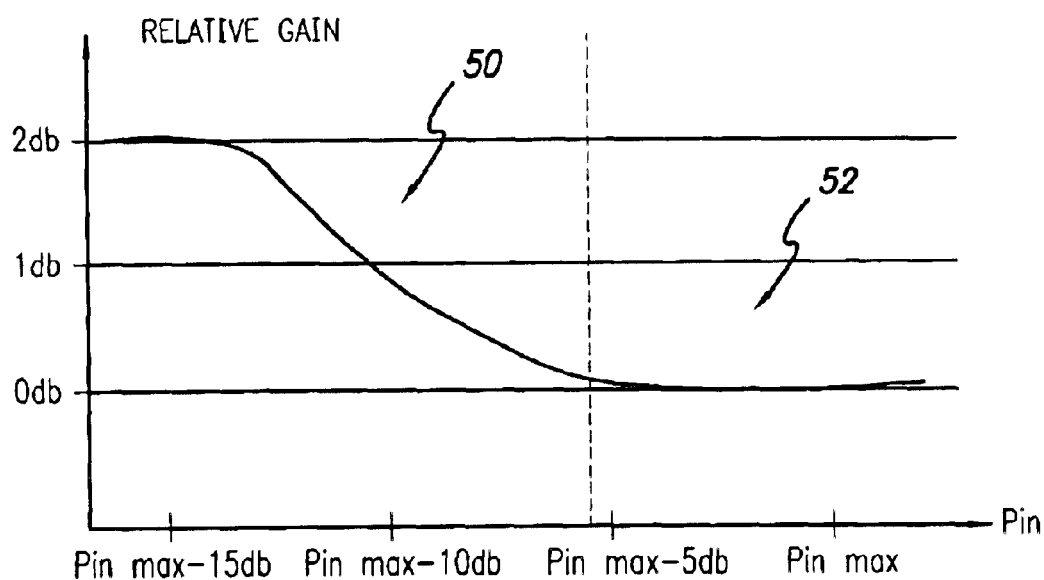
FIG. 8 is a plot of the specific gain characteristic values in one specific example of the soft gain compressor employed in the feed forward power amplifier of FIG. 3 shown over a specific operating range.

Referring to FIG. 8, one specific example of a gain response curve for the soft gain compressor 22 is illustrated. As shown the gain response has a nonlinear portion from about Pin (max) −15 db to Pin (max) −5 db, where Pin (max) is the saturation level of the main amplifier devices. Pin (max) −5 db thus generally corresponds to Psst, the threshold of the small signal region 50 of a typical LDMOS power amplifier device biased in lower class AB or in class B. Above about Pin (max) −5 db the gain response is substantially linear as shown (corresponding to region 52 of FIG. 4).

In below Table 1, the specific operating characteristics of main amplifier 16 and error amplifier 34 are shown for one example LDMOS (Laterally Diffused Metal Oxide Semiconductor) amplifier device. FIG. 8 discussed above and Table 1 assume that 100 Watt P1 dB devices, specifically 100 Watt LDMOS amplifier devices with saturation at about 1 dB, are used in the main and error amplifiers. Table 1 provides bias classes for the main amplifier and error amplifier in terms of quiescent bias currents (Idd) as a percentage of saturation current (Idss) for the amplifier devices. The preferred high efficiency ranges are shown with more conventional linear (inefficient) ranges in the shaded regions of the table. Although these specific values correspond to one device example, i.e. 100 watt LDMOS P1 dB devices, these bias class characteristics and operating ranges will scale quite generally across both larger and smaller devices. Accordingly, these bias class definitions and operating ranges are not limited to the specific power example. Nonetheless, the bias class definitions of Table 1 may not specifically correspond to the Table 1 device parameters for all amplifier device types. The distinction between bias classes and the definition of class C, Class B, lower class AB (AB2), higher class AB (AB1) and class A are generally understood in the art for a wide variety of devices, however, and therefore the Table 1 device parameter values should be viewed as illustrative and not limiting in nature.

TABLE 1

Nominal Quiescent Bias Currents, per device, at 25° C.

| Idss | 12.0 | Amp | | | | | | |
|---|---|---|---|---|---|---|---|---|
| | Main Min | | Main Max | | Error Min | | Error Max | |
| Class of Operation | Idd (Amp) | % Idss | Idd (Amp) | % Idss | Idd (Amp) | % Idss | Idd (Amp) | % Idss |
| C | 0.000 | 0.00% | 0.000 | 0.00% | 0.000 | 0.00% | 0.000 | 0.00% |
| B | 0.000 | 0.000 | 0.200 | 1.6% | 0.000 | 0.000 | 0.200 | 1.6% |
| AB2 | 0.200 | 1.66% | 0.900 | 7.7% | 0.200 | 1.66% | 0.900 | 7.7% |
| AB1 | 0.900 | 7.7% | 1.300 | 10.80% | 0.900 | 7.7% | 1.300 | 10.80% |
| A | 1.300 | 10.80% | 6.000 | 50% | 1.300 | 10.80% | 6.000 | 50% |

As may be seen from Table 1, both the main and error amplifier are biased in a high efficiency class, specifically lower Class AB (AB2) or class B (or optionally, but not preferred, Class C). This provides the desired maximum DC to RF conversion efficiency for a given device size. In addition to reducing wasted power, this DC to RF efficiency increases reliability. More specifically, when modern RF power devices such as LDMOS amplifier devices are operated at higher efficiency levels this directly translates into lower channel temperature. Reduction in channel temperature greatly increases the mean lifetime of the device and thus improves overall reliability of the feed forward power amplifier system. All these advantages are provided without sacrificing linearity due to small signal gain expansion by use of the small signal linearization circuit and method described above.

A preferred embodiment of the present invention in an RF power amplifier design which provides both high efficiency and reduced small signal distortion has been described in relation to the various figures. Nonetheless, it will be appreciated by those skilled in the art that a variety of modifications and additional embodiments are possible within the teachings of the present invention. For example, a variety of specific circuit implementations for the soft gain compressor may be provided employing the teachings of the present invention and limitations of space prevent an exhaustive list of all the possible circuit implementations or an enumeration of all possible control implementations. A variety of other possible modifications and additional embodiments are also clearly possible and fall within the scope of the present invention. Accordingly, the described specific embodiments and implementations should not be viewed as in any sense limiting in nature and are merely illustrative of the present invention.

What is claimed is:

1. An amplifier, comprising:

an input for receiving a signal to be amplified;

an amplifier device biased to have a nonlinear gain characteristic in the small signal region;

a small signal linearization circuit coupled between said input and said amplifier device for compensating for the small signal nonlinearity of said amplifier device, said small signal linearization circuit comprising an envelope detector an a gain control circuit controlled in response to the envelope of the input signal detected by the envelope detector; and an output coupled to the amplifier device for outputting the amplified signal.

2. An amplifier as set out in claim 1, wherein said amplifier device is an LDMOS transistor.

3. An amplifier as set out in claim 1, wherein said amplifier device is biased in lower class AB or in class B.

4. An amplifier as set out in claim 1, wherein said small signal linearization circuit reduces the input signal magnitude over a portion of the gain response of the amplifier device corresponding to the small signal region.

5. An amplifier as set out in claim 4, wherein said small signal linearization circuit has a gain response substantially opposite to said gain response of the amplifier device.

6. An amplifier as set out in claim 4, wherein the portion of the gain response of the amplifier device corresponding to said small signal region comprises the range of about −15 dB to −5 dB of maximum input power.

7. An amplifier, comprising:

an input for receiving a signal to be amplified;

an amplifier device biased to have a nonlinear gain characteristic in the small signal region;

a small signal linearization circuit coupled between said input and said amplifier device for compensating for the small signal nonlinearity of said amplifier device, said small signal linearization circuit comprising a first and second diode in parallel coupled between the signal input path and ground and a resistor coupled in series with the first and second diode and ground; and an output coupled to the amplifier device for outputting the amplified signal.

8. An amplifier as set out in claim 1, wherein said small signal linearization circuit further comprises a video amplifier coupled between said envelope detector and said gain control circuit.

* * * * *

UNITED STATES PATENT AND TRADEMARK OFFICE
CERTIFICATE OF CORRECTION

PATENT NO.   : 6,850,115 B2
DATED        : February 1, 2005
INVENTOR(S)  : Mark Gurvich and Nikolai Maslennikov It is certified that error appears in the above-identified patent and that said Letters Patent is hereby corrected as shown below:

Column 8,
Line 19, please delete "an" and substitute the following -- and --

Signed and Sealed this

Fourteenth Day of June, 2005

JON W. DUDAS
*Director of the United States Patent and Trademark Office*